(12) United States Patent
Sueki et al.

(10) Patent No.: US 6,233,906 B1
(45) Date of Patent: May 22, 2001

(54) CARRIER TAPE CUTTER AND COMPONENT PACKAGING MACHINE

(75) Inventors: Makoto Sueki; Hideki Uchida; Kazuhiko Narikiyo, all of Yamanashi (JP)

(73) Assignee: Matsushita Electric Industrial, Co., Ltd., Osaka (JP)

( * ) Notice: Subject to any disclaimer, the term of this patent is extended or adjusted under 35 U.S.C. 154(b) by 0 days.

(21) Appl. No.: 09/242,017

(22) PCT Filed: Aug. 7, 1997

(86) PCT No.: PCT/JP97/02743

§ 371 Date: Feb. 5, 1999

§ 102(e) Date: Feb. 5, 1999

(87) PCT Pub. No.: WO98/07307

PCT Pub. Date: Feb. 19, 1998

(30) Foreign Application Priority Data

Aug. 8, 1996 (JP) .................................................. 8-225920

(51) Int. Cl.[7] ................................................ B65B 43/26
(52) U.S. Cl. ............................................. 53/381.2; 53/492
(58) Field of Search ................................... 53/492, 381.2, 53/55; 414/412; 229/606, 629

(56) References Cited

U.S. PATENT DOCUMENTS

| 4,522,011 | * | 6/1985 | Bauers et al. | 53/55 |
| 4,954,250 | * | 9/1990 | Weihe et al. | 209/629 |
| 5,390,472 | * | 2/1995 | Weiler et al. | 53/492 |
| 5,660,305 | * | 8/1997 | Lasher et al. | 53/492 |
| 5,667,073 | * | 9/1997 | Okui . | |
| 5,682,731 | * | 11/1997 | Althouse | 53/492 |
| 5,816,527 | * | 10/1998 | Nakae et al. . | |
| 6,009,686 | * | 1/2000 | Robinson | 53/492 |

FOREIGN PATENT DOCUMENTS

| 1-164587 | 6/1989 | (JP) . |
| 1-310891 | 12/1989 | (JP) . |
| 7-30297 | 1/1995 | (JP) . |

* cited by examiner

*Primary Examiner*—Eugene Kim
(74) *Attorney, Agent, or Firm*—Wenderoth, Lind & Ponack, L.L.P.

(57) ABSTRACT

The apparatus comprises a reciprocal blade (30) having edges (31, 32) respectively set at a side of a forward end and at a side of a return end of reciprocation, and fixed blades (33, 34) having edges respectively set at the side of the forward end and the return end to cooperate with the edges at the forward end and the return end of the reciprocal blade. The reciprocal blade and the fixed blades cooperate with one another to cut a carrier tape with a shearing force. Partitioned carrier tape storage parts (37, 38) are disposed below respective shear parts formed between the edge at the forward end of the reciprocal blade and the corresponding edge of a fixed blade, and between the edge at the return end of the reciprocal blade and the corresponding edge of a fixed blade. When an emptied carrier tape (23), after a component is removed therefrom, is cut by the edge at the forward end or at the return end of the reciprocal blade and the edge of the fixed blade at the same side as the cutting edge of the reciprocal blade, the cut carrier tape is sorted and collected in the carrier tape storage parts in accordance with a kind of the carrier tape. The carrier tape can hence be sorted and collected for every kind thereof simply by changing a drive direction of the reciprocal blade in accordance with the kind of the carrier tape.

20 Claims, 8 Drawing Sheets

CARRIER TAPE CUTTER AND COMPONENT PACKAGING MACHINE

TECHNICAL FIELD

The present invention relates to a cutting apparatus for cutting an emptied carrier tape (band-shaped long material) after electronic components or the like components, stored in the carrier tape and carried therein are removed from the tape and mounted to a printed board or the like. The present invention also relates to a component mounting machine having the carrier tape cutting apparatus.

BACKGROUND ART

Recent machines for mounting electronic components to printed boards are adapted to operate at high speed, and high-speed supply of the electronic components is demanded to cope with the high-speed operation. For this reason, an increasing number of the mounting machines are fitted to a package transfer system realizing a high supply speed and stable supply of the electronic components to the machines with the use of a carrier tape, i.e. a band-shaped long material having a plurality of recesses to hold the electronic components therein and carry them.

In a conventional electronic component mounting machine, the emptied carrier tape, after the electronic component is removed therefrom, is sequentially cut by a cutting apparatus installed in the machine )referring to Japanese unexamined Patent Publication Nos. 1-164587 and 1-310891).

Figure 4:
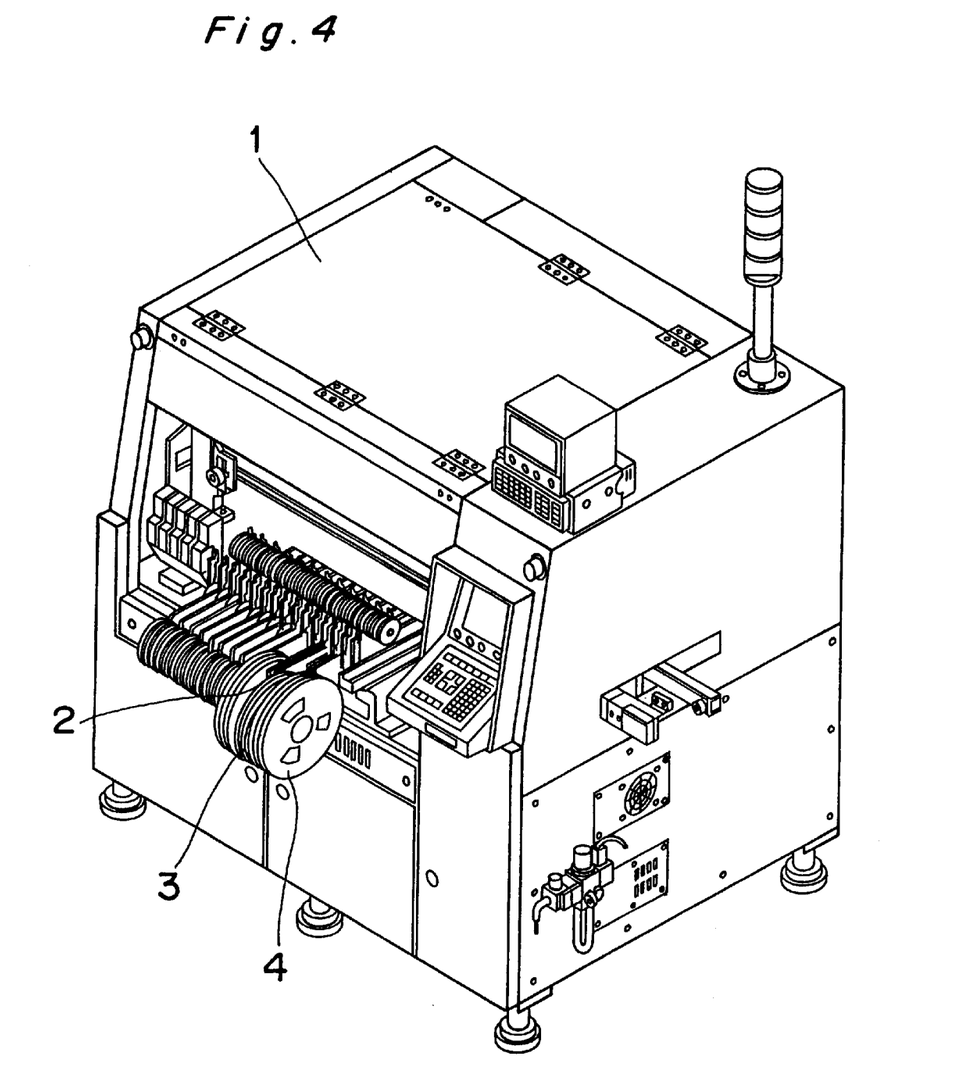
FIG. 4 is a perspective view showing an appearance of an electronic component mounting machine.
Figure 5:
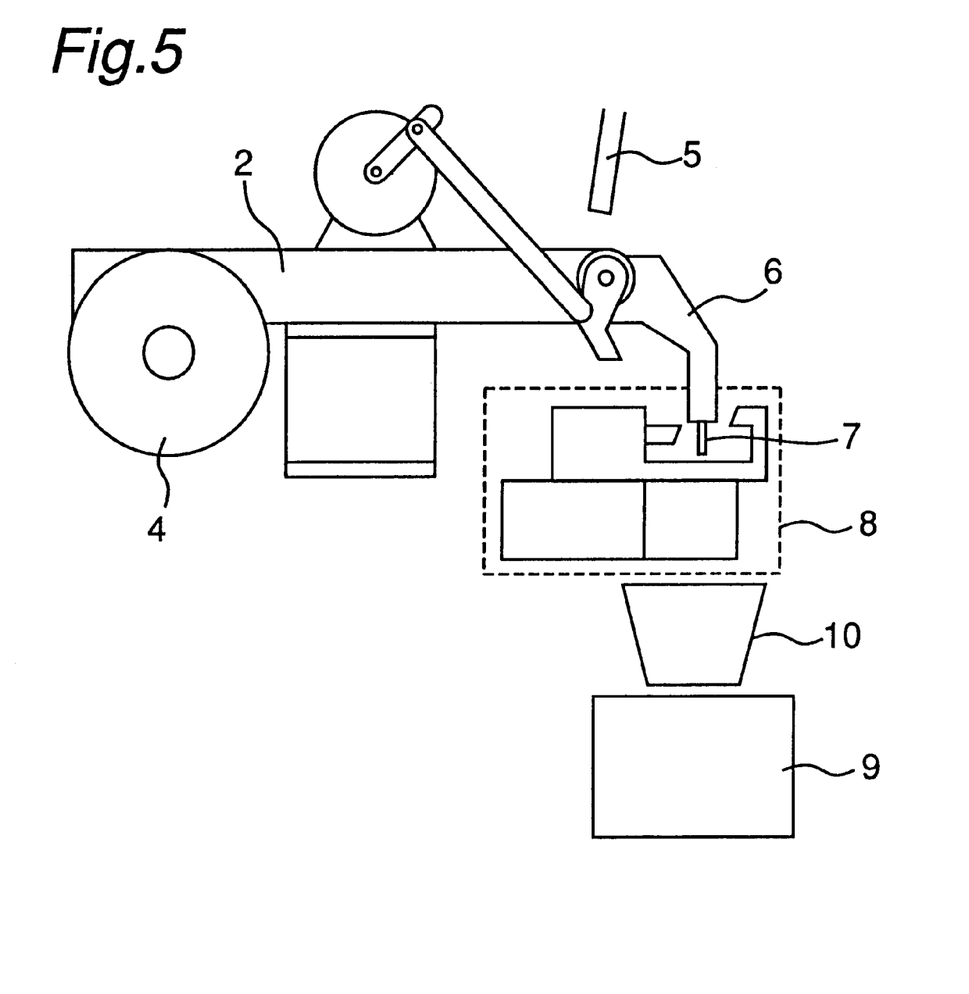
FIG. 5 is a diagram of the constitution of a conventional carrier tape cutting apparatus when set to the electronic component mounting machine of FIG. 4.
Figure 6A:
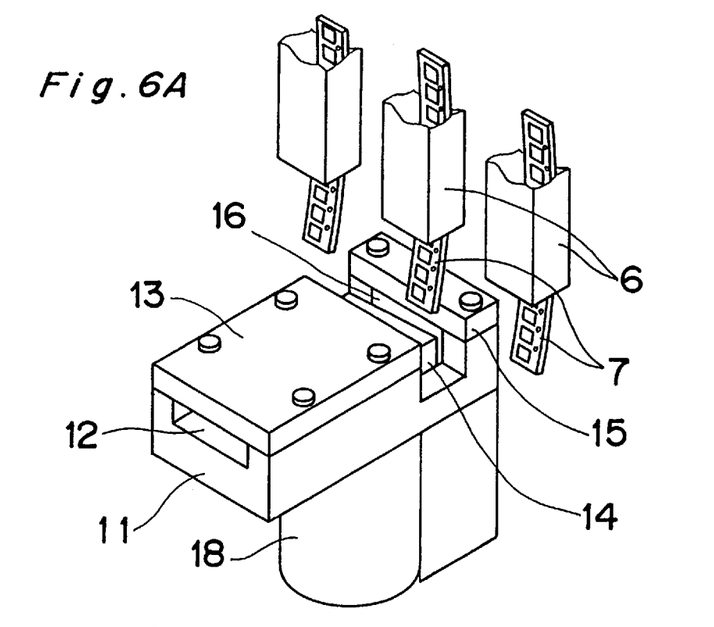
FIG. 6A is a perspective view of the conventional carrier tape cutting apparatus.
Figure 6B:
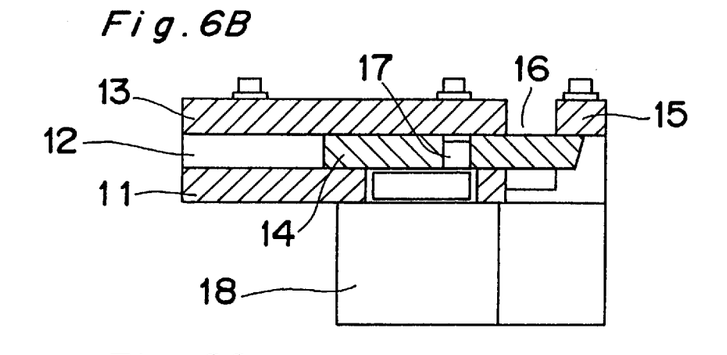
FIG. 6B is a sectional side view of the carrier tape cutting apparatus of FIG. 6A.
Figure 6C:
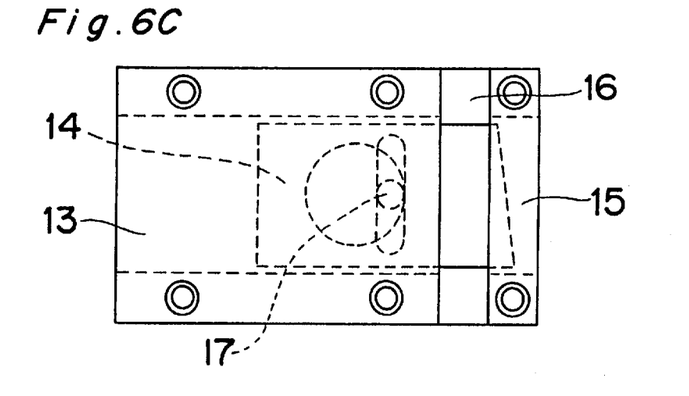
FIG. 6C is a plan view of the carrier tape cutting apparatus of FIG. 6A.
Figure 7:
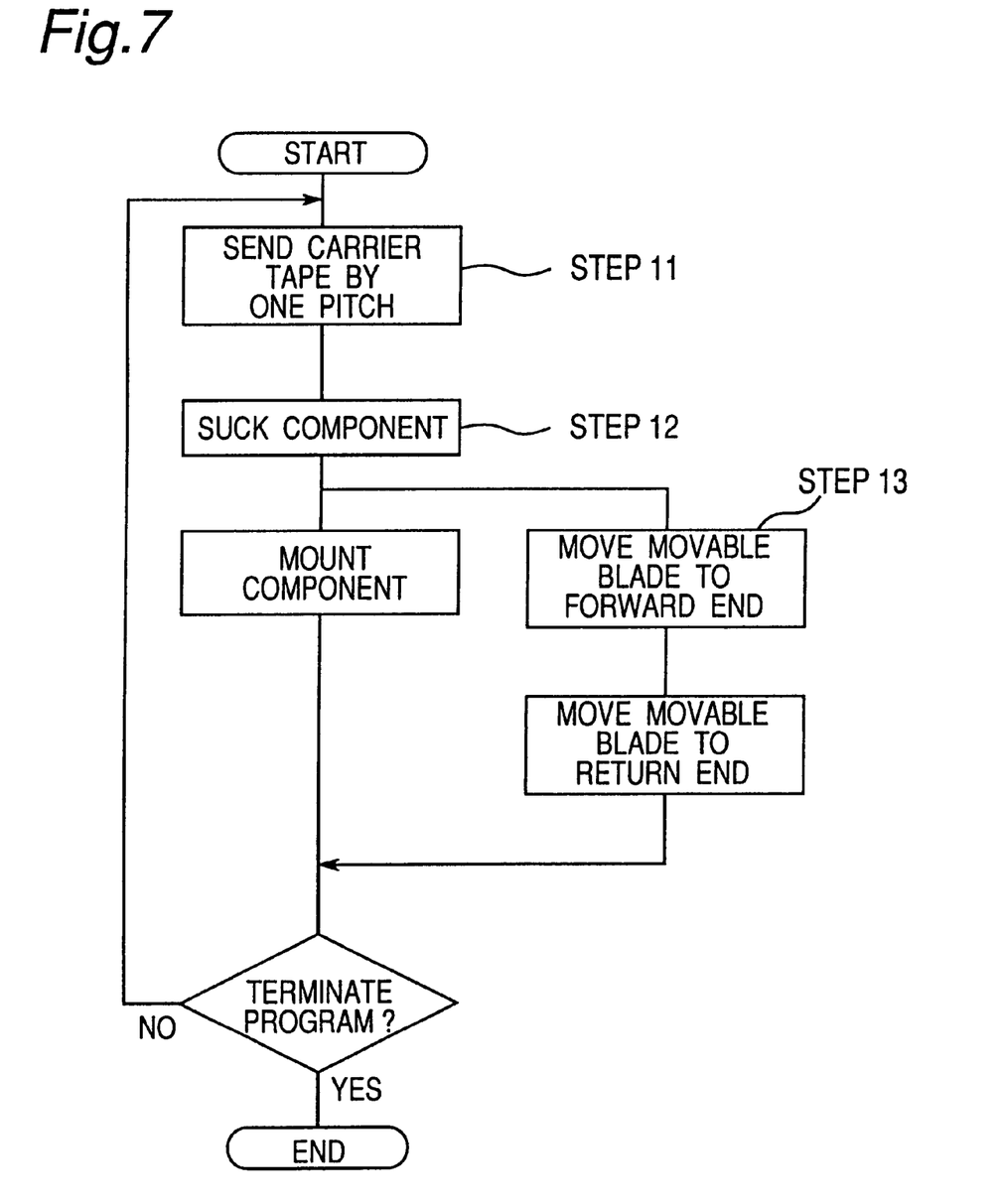
FIG. 7 is a flow chart explanatory of the operation of the conventional carrier tape cutting apparatus of FIGS. 5 and 6A–6C.

The conventional carrier tape cutting apparatus installed in the electronic component mounting machine will be described below. FIG. 4 is a perspective view of an appearance of the electronic component mounting machine, FIG. 5 is a diagram showing the constitution of the conventional carrier tape cutting apparatus in a state while set to the electronic component mounting machine of FIG. 4; FIG. 6A is a perspective view showing the appearance of the constitution in detail of the conventional carrier tape cutting apparatus of FIG. 5; FIGS. 6B and 6C are a side sectional view and a top view of the same apparatus, respectively. And FIG. 7 is a flow chart for explaining the operation of the conventional carrier tape cutting apparatus shown in FIGS. 4, 5 and 6A–6C.

Referring to FIG. 4, reference numerals 1–3 represent respectively a main body part of the electronic component mounting machine, an electronic component feeding apparatus set at the main body part 1 of the electronic component mounting machine, and a carrier tape wound to a reel 4 of the electronic component feeding apparatus 2 and holding electronic components therein. In FIG. 5, reference numbers 5, 6, 8, 9 respectively indicate a suction nozzle for sucking the electronic components out of the carrier tape 3 set from the reel 4 of the electronic component feeding apparatus 2, a dust pipe forwarding an emptied carrier tape 7 after the electronic component is removed therefrom by the suction nozzle 5, a cutting apparatus for cutting the emptied carrier tape 7 sent from the dust pipe 6, and a dust box for storing the carrier tape 7 cut by the cutting apparatus 8, via a dust chute 10.

In FIGS. 6A, 6B, and 6C, reference numerals 11–18 respectively indicate a main body part of the carrier tape cutting apparatus 8, an slide groove formed in the main body part 11, an upper lid covering the slide groove 12, a movable blade sliding in the slide groove 12 of the main body part 11, a fixed blade disposed above the slide groove 12 for cutting the carrier tape in cooperation with the movable blade 14, a carrier tape insertion part where the emptied carrier tape 7 is inserted into a shear part formed between the movable blade 14 and the fixed blade 15, a roller follower, and a driving part.

The conventional carrier tape cutting apparatus set to the electronic component mounting machine and constituted as above will be discussed with reference to the flow chart of FIG. 7, which is explanatory of the operation thereof. The carrier tape 3 holding electronic components therein is fitted to the electronic component feeding apparatus 2 while being wound to the reel 4, set at the main body part 1 of the electronic component mounting machine, and then sent forward by one pitch by the electronic component feeding apparatus 2 (step 11). After the electronic component stored in the carrier tape 3 is sucked by the suction nozzle 5 (step 12), the emptied carrier tape 7 discharged from the dust pipe 6 of the electronic component feeding apparatus 2 is inserted through the carrier tape insertion part 16 of the cutting apparatus 8. At this time, the movable blade 14 slides toward a forward end in the slide groove 12, thereby cutting the carrier tape 7 by a shearing force exerted together with the fixed blade 15 (step 13). The cut carrier tape 7 drops in the dust chute 10 to be accommodated and collected in the dust box 9.

In the above-described conventional constitution of the carrier tape cutting apparatus 8, the sent carrier tape 7 is simply sequentially cut. This is, the carrier tape 7 is collected in the same dust box 9 without being sorted with regard to whether the carrier tape 7 is formed of paper or resin.

The present invention is devised to solve the above issue inherent in the prior art, and has for its object to provide a carrier tape cutting apparatus whereby a cut carrier tape can be sorted and collected in accordance with a material thereof, without any limit as to the amount of different materials, when the carrier tape holding components therein is set to a component feeding apparatus. Also provided is a component mounting machine having the carrier tape cutting apparatus.

DISCLOSURE OF INVENTION

In order to solve the aforementioned issue, the present invention is constituted as follows.

There is provided a carrier tape cutting apparatus according to a first aspect of the present invention, which comprises:

a movable blade that is movable back and forth, and has edges respectively set at a side of a forward end and at a side of a return end of reciprocation;

fixed blades having edges respectively set at the side of the forward end and at the side of the return end, and which are to cooperate with the edges at the forward end and the return end of the movable blade, thereby cutting a carrier tape with a shearing force; and partitioned carrier tape storage parts which are disposed below respective shear parts formed between the edge at the forward end of the movable blade and the corresponding edge of the fixed blade, and of the edge at the return end of the movable blade and the corresponding edge of the fixed blade such that when the emptied carrier tape, after a component is removed therefrom, is cut by the edge at the forward end or at the return end of the movable blade and the edge of the fixed blade at the same side as the cutting edge of the movable blade, the cut carrier tape is sorted and collected in the storage parts in accordance with a kind of the carrier tape.

According to a second aspect of the present invention, there is provided the carrier tape cutting apparatus of the first aspect, which comprises flaps respectively set under the edges at the forward end and the return end of the removable blade. The flaps move integrally with the edges at the forward end and the return end of the movable blade, thereby guiding the cut carrier tape to drop in a predetermined one of the partitioned carrier tape storage parts.

According to a third aspect of the present invention, there is provided with the carrier tape cutting apparatus according to the first aspect or second aspect of the present invention, a driving device for reciprocating the movable blade; and a control device for determining an operation direction of the movable blade in accordance with the kind of the carrier tape, and then controlling driving of the driving device.

A component mounting machine according to a fourth aspect of the present invention has the carrier tape cutting apparatus according to any one of the first–third aspects.

In a method according to a fifth aspect of the present invention for mounting a component with the use of the component mounting machine of the fourth aspect of the present invention, the electronic component mounting machine operates as follows:

while sequentially conveying the carrier tape holding components therein, removing one of the components from the carrier tape and mounting the component to a board;

determining an operation direction of the movable blade in accordance with the kind of the carrier tape; and driving the movable blade in accordance with the determined operation direction, thereby cutting the emptied carrier tape, after the component is removed therefrom, by the edge at the forward end of the movable blade and the corresponding edge of the fixed blade at the same side as the edge of the movable blade, or by the edge at the return end of the movable blade and the corresponding edge of the fixed blade at the same side as the edge of the movable blade, and simultaneously sorting and collecting the cut carrier tape in accordance with the kind of the tape into the carrier tape storage parts.

In the above constitution, the emptied carrier tape, after the component is take therefrom, is cut by sliding the movable blade, having edges both at the forward end and at the return end, relative to the fixed blade such that the carrier is tape is cut with a shearing force. The cut carrier tape is sorted and collected in the carrier tape storage parts that are partitioned for every kind of the carrier tape, which storage parts are below respective shear parts formed between the edge at the forward end of the movable blade and the fixed blade and between the edge at the return end of the movable blade and the fixed blade. The carrier tape can be sorted and collected separately for every kind thereof in a simple operation by merely changing a drive direction of the movable blade.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Before the description of the present invention proceeds, it is to be noted that like parts are designated by like reference numerals throughout the accompanying drawings.

A carrier tape cutting apparatus according to a first embodiment of the present invention is so constituted as to cut an emptied carrier tape after an electronic component is removed therefrom by a movable blade having edges both at a forward end and at a return end, and a fixed blade providing a shearing force to the edges at the forward end and return end of the movable blade. A partitioned dust box is arranged below shear parts formed between the forward end and return end edges of the movable blade and the fixed blade to sort and collect the cut carrier tapes in accordance with kinds of the tapes. In this constitution, the shear part where the emptied carrier tape is cut is selected to be either between the forward end edge of the movable blade and the fixed blade or between the return end edge of the movable blade and the fixed blade. That is, the carrier tape cutting positions are changed, so that the carrier tapes can be sorted in accordance with the kinds thereof. Or a cut position on the carrier tape is changed, thereby sorting the carrier tapes in accordance with the kinds of the tapes.

In a carrier tape cutting apparatus, according to a second embodiment of the present invention, a flap is provided under each of the forward end edge and return end edge of the movable blade in the carrier tape cutting apparatus of the first embodiment. The flaps move integrally with the edges, thereby guiding the cut carrier tapes to fall into a predetermined part of the partitioned dust box. In the constitution with the flaps respectively attached to the forward end edge and the return end edge of the movable blade, the carrier tape cut at the respective shear part between the movable blade and the fixed blade is prevented from falling to a wrong part of the partitioned dust box.

In a carrier tape cutting apparatus, according to a third embodiment of the present invention, an electronic component mounting machine is provided which includes the carrier tape cutting apparatus of the first embodiment, wherein the carrier tape with electronic components held therein is set in a manner to be sequentially conveyed so that the electronic components are taken out from the carrier tape and mounted to boards, while an operation direction of the movable blade is determined in accordance with the kind of the carrier tape. According to the construction, irrespective of a manner as to how the carrier tape holding the electronic components therein is set in the electronic component mounting machine, and simply by determining the operation direction of the movable blade in conformity with the kind of the carrier tape, the cut carrier tape is allowed to drop into a predetermined part of the partitioned dust box.

The above-described first–third embodiments will be more fully described with reference to the drawings.

Figure 1:
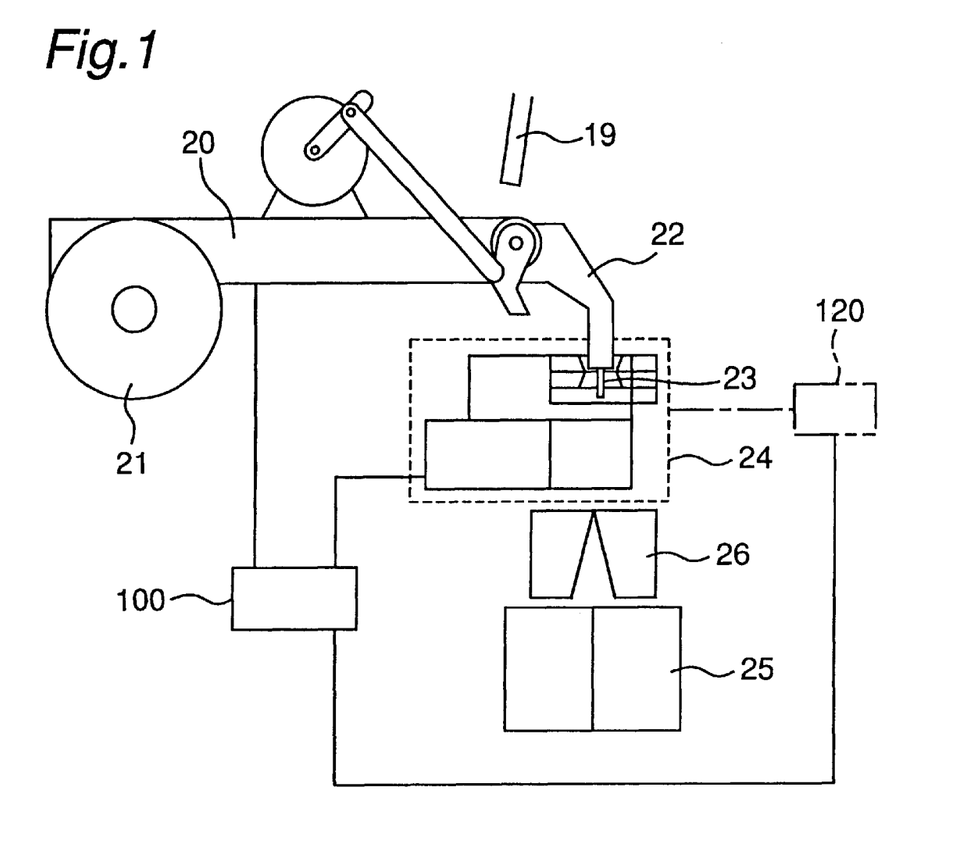
FIG. 1 is a diagram showing the constitution of a carrier tape cutting apparatus in accordance with a first aspect of the present invention.
Figure 2A:
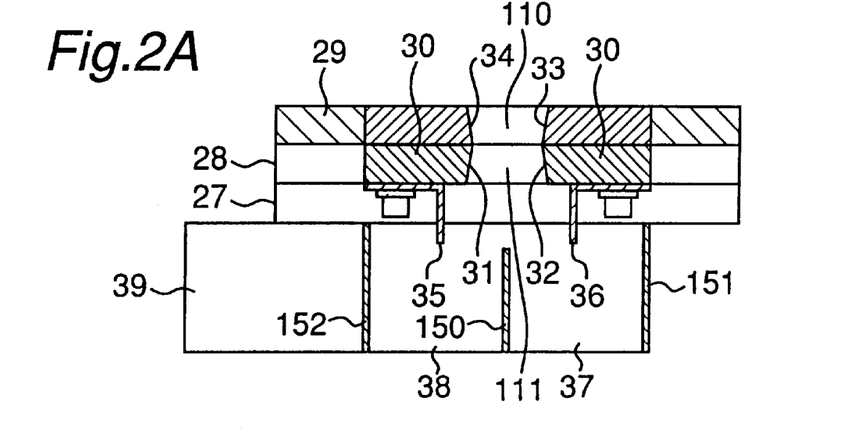
FIG. 2A is a sectional side view of the carrier tape cutting apparatus.
Figure 2B:
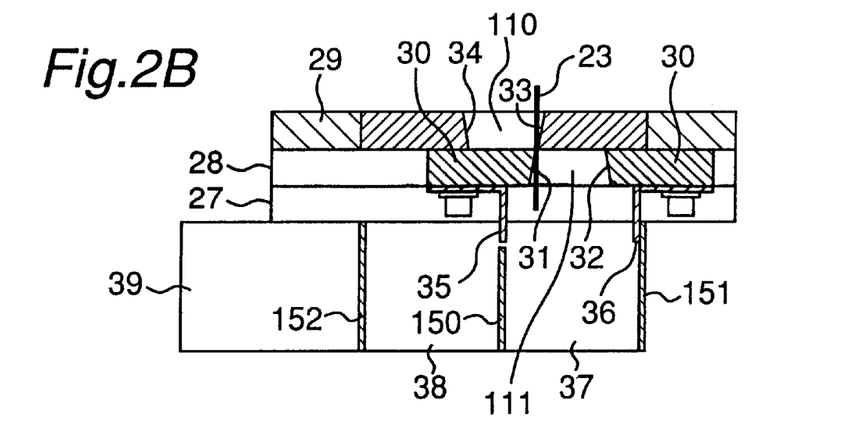
FIGS. 2B and 2C are respective section side views of the carrier tape cutting apparatus showing a first and a second cutting position of the present invention while cutting a carrier tape.
Figure 2C:
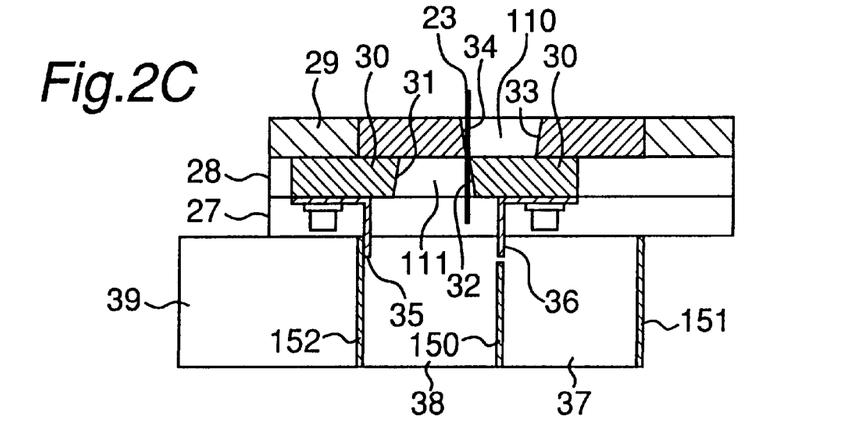
Figure 3A:
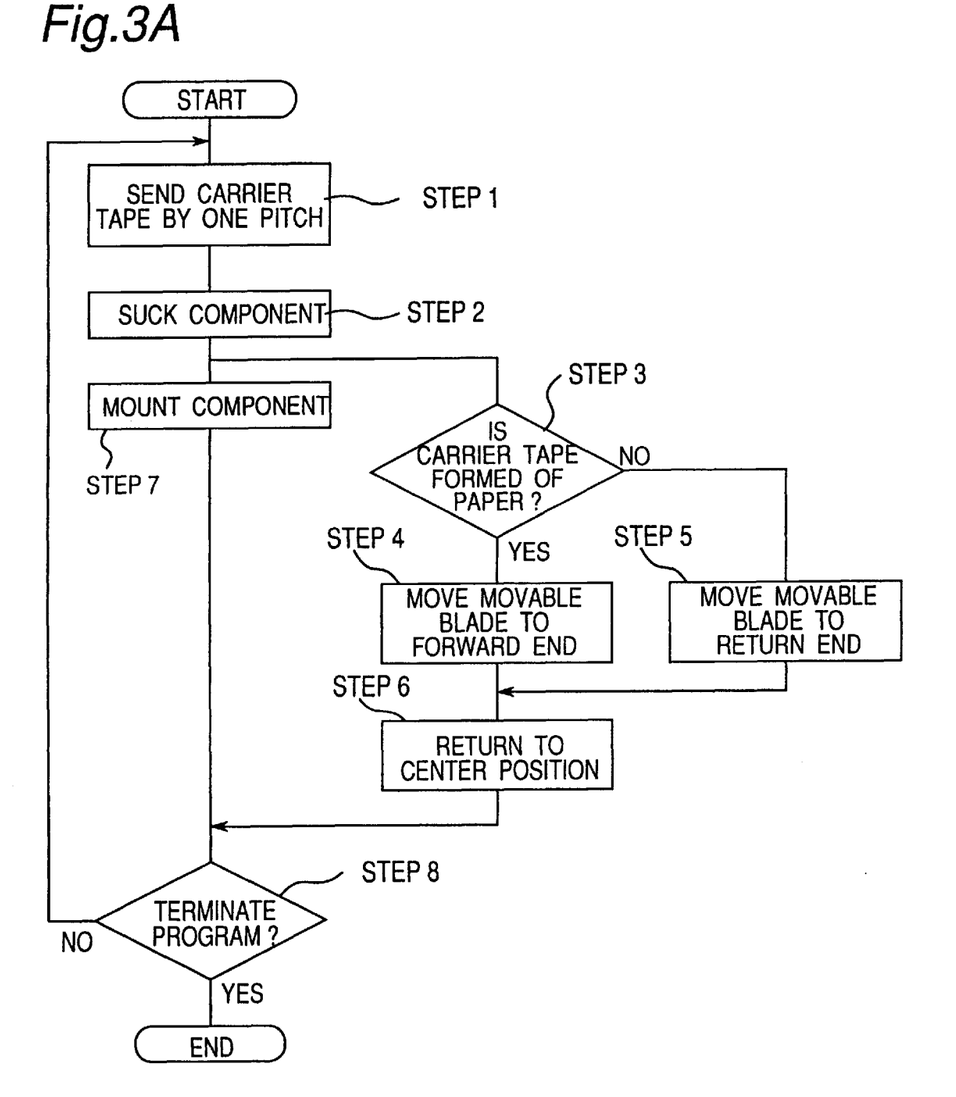
FIG. 3A is a flow chart of the operation of the carrier tape cutting apparatus shown in FIGS. 1 and 2A–2C.
Figure 3B:
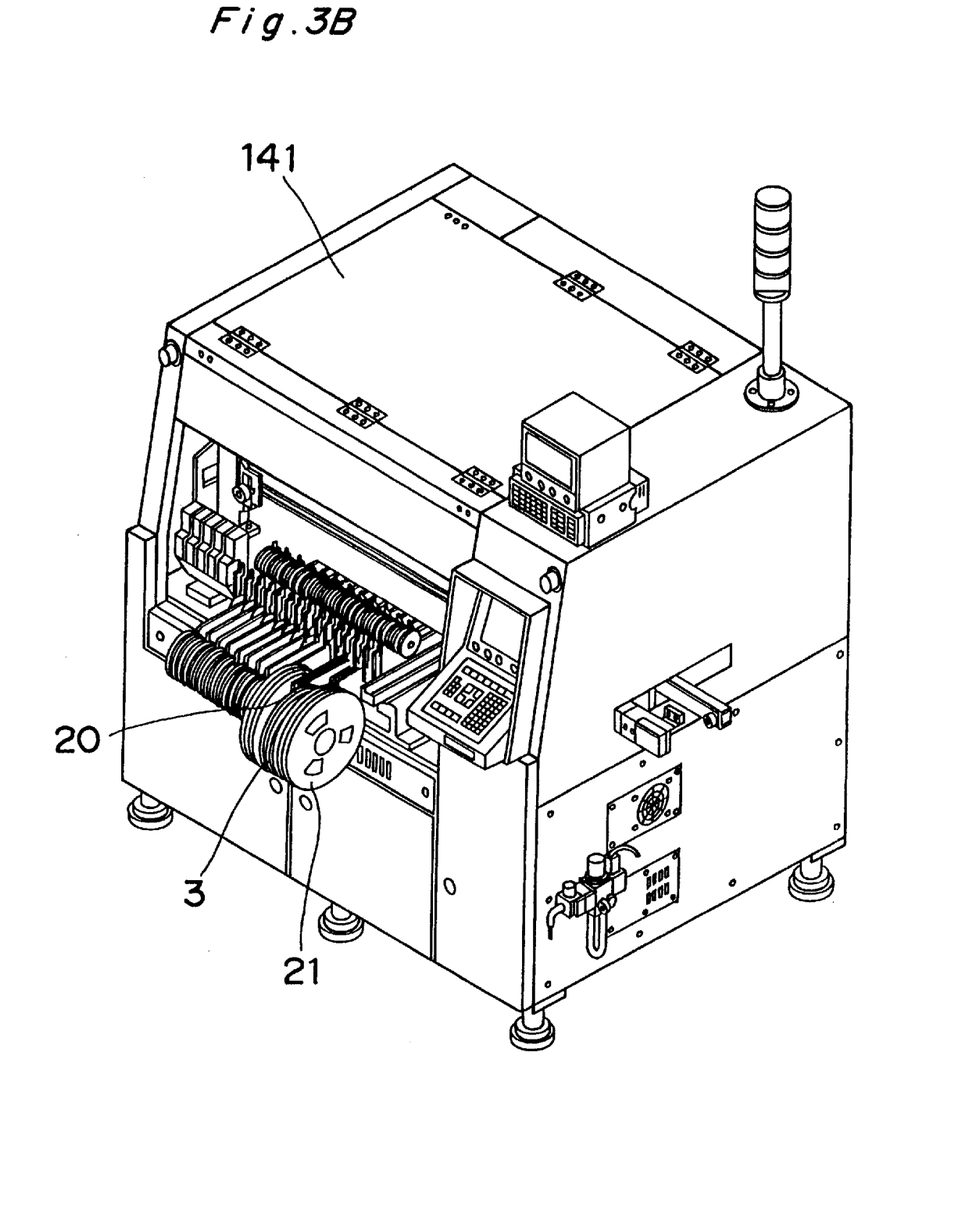
FIG. 3B is a perspective view of a component mounting machine according to a second aspect of the present invention.

FIG. 1 is a diagram of the constitution of the carrier tape cutting apparatus in the first embodiment of the present invention when set to an electronic component mounting machine of FIG. 3B. FIG. 2A is a sectional side view showing the constitution in detail of the carrier tape cutting apparatus of FIG. 1. FIGS. 2B and 2C are sectional side views of the carrier tape cutting apparatus in a state when cutting a carrier tape, a FIG. 3A is a flow chart descriptive of the operation of the carrier tape cutting apparatus of FIGS. 1 and 2A–2C. In addition to the carrier tape cutting apparatus of the first embodiment, FIGS. 2A–2C include flaps 35, 36 of the carrier tape cutting apparatus according to the second embodiment in a state to be fixed to a lower face of a movable blade 30.

In FIG. 1, reference number 19 denotes a suction nozzle which sucks and takes out an electronic component from a carrier tape 3 sent from a reel 21 of an electronic component feeding apparatus 20. Reference numeral 22 denotes a dust pipe which conveys an emptied carrier tape 23 after the electronic component is taken out by the suction nozzle 19. Reference numeral 24 denotes a cutting apparatus which cuts the emptied carrier tape 23 sent from the dust pipe 22. Reference number 25 denotes a dust box as an example of a carrier tape storage device which stores the carrier tape 23 that has been cut by cutting apparatus 24 via a dust chute 26.

In FIGS. 2A, 2B, and 2C, reference number 27 denotes a main body part of the carrier tape cutting apparatus 24, 28 denotes a slide groove formed at the main body part 27, 29 denotes an upper lid covering the slide groove 28, and 30 denotes the movable blade sliding in the slide groove 28 of the main body part 27. 31 and 32 denotes edges which are provided to face each other in a carrier tape insertion space 110 respectively at the sides of a forward end and a return end of the movable blade 30 sliding in the slide groove 28, and 33 and 34 denote fixed blades which are formed to face each other in the carrier tape insertion space 110 to exert a shearing force with the corresponding edges 31 and 32 at the forward end and the return end of the movable blade 30. This shearing force cuts carrier tape. 35 and 36 denotes flaps moving along with the movable blade 30 and fixedly attached below the edges 31 and 32 at the forward end and the return end, 37 denotes a first dust box arranged below a shear part defined between the edge 31 at the forward end of the movable blade 30 and the fixed blade 33, and 38 denotes a second dust box disposed below a shear part of the edge 32 at the rear end of the movable blade 30 and the fixed blade 34. 39 denotes a driving part comprising a roller follower engaged with the movable blade 30, and a motor rotating the roller follower back and forth, thereby reciprocating the movable blade 30 between the forward end and the return end. The emptied carrier tape 23, after the electronic component is removed therefrom, is inserted into the shear part formed between the edge 31 of the movable blade 30 and the fixed blade 33, or between the edge 32 of the movable blade 30 and the fixed blade 34.

The operation of the carrier tape cutting apparatus in the first embodiment constituted as hereinabove will be depicted with reference to the flow charge of FIG. 3A for explaining the operation and the component mounting machine 141 in the third embodiment of the present invention shown in a FIG. 3B.

By way of example, here, a carrier tape 23 of paper is cut at the shear part formed between the edge 31 of the movable blade 30 and the fixed blade 33, and a carrier tape 23 of resin is cut at the shear part between the edge 32 of the movable blade 30 and the fixed blade 34.

As indicated in FIG. 3B, the carrier tape 3 storing electronic components is installed in the electronic component feeding apparatus 20 while wound to the reel 21, which is set at a main body part 1 of the electronic component mounting machine. The carrier tape 3 is transferred by one pitch by the electronic component feeding apparatus 20 (step 1). The carrier tape 3 and the electronic component stored in the carrier tape are sucked by the suction nozzle 19 (step 2). Then, the emptied carrier tape 23 is discharged through the dust pipe 22 of the electronic component feeding apparatus 20 and is detected by a control device 100, which determines whether the emptied carrier tape 23 is formed of paper or resin (step 3).

For determining by the control deice 100 as whether the carrier tape 23 is of paper or resin for example, material information of the carrier tape, holding the components to be used, is input into the control device 100 from a control device of the component feeding apparatus 20 or component mounting machine main body, so that whether the carrier tape is formed of paper of resin is judged on the basis of this input information, and the driving of the driving part 39 is accordingly controlled. When the carrier tape 23 is judged to be paper by the control device 100, the driving part 39 moves the movable blade 30 to the forward end by the control of the control device 100 (step 4), the emptied carrier tape 23 is cut at the shear part formed between the edge 31 and the fixed blade 33, and is dropped into the first dust box 37 under the guidance of the flaps 35, 36. On the other hand, when the carrier tape 23 is judged to be of resin by the control device 100, the driving part 39 moves the movable blade 30 to the return end through the control of the control device 100 (step 5), the emptied carrier tape 23 is cut at the shear part formed between the edge 32 and fixed blade 34, and is then guided by the flaps 35, 36 and dropped to the second dust box 38. In the thus-discussed manner, movement of the movable blade 30 can be selected in accordance with the kind of the emptied carrier tape 23 by the control device 100, such that it can be determined at which of the forward end and the return end of the movable blade 30 the emptied carrier tape 23 is to be cut. A drive direction of the movable blade 30 can be controlled in accordance with the kind, e.g. material, of the carrier tape if the kind is registered in the electronic component mounting machine or the like beforehand for every component to be mounted.

After step 4 or 5, the movable blade 30 is always returned to a neutral position at the center to be prepared for cutting a next carrier tape 23 (step 6). Meanwhile, the component sucked by the suction nozzle in step 2 is mounted to a predetermined point of a board at the component mounting machine (step 7). The operation in step 7 can be carried out concurrently with operations in steps 3–6. It is detected last in step 8 as to whether or not the program is finished, that is, whether or not the components are completely mounted to the board. The mounting operation is terminated when the components are perfectly mounted to the board, whereas the program returns to step 1 unless the operation is finished.

Because of the flaps 35, 36 provided at the edges 31, 32 of the movable blade 30, the carrier tape 23 can be sorted and separately collected even when the movable blade 30 moves when the carrier tape as it is being cut. Distances between the edges 31, 32 of the movable blade 30 and the fixed blades 33, 34, and inclinations thereof may be adjusted to assign either set of the edges and the blades for the paper or resin carrier tape.

The flaps 35, 36 are preferably attached to the movable blade so that the flaps 35, 36 can be long enough to guide the cut carrier tape into a predetermined dust box, and not in the other dust box, without interfering with the driving of the movable blade. More specifically, as shown in FIGS. 2A–2C, a partition 150 between the first dust box 37 and the second dust box 38 is short so as to not be in contact with the flaps 35, 36, and is regulated to be nearly even with the flaps 35, 36 when the movable blade 30 stops at each of the forward end and the return end so as to prevent the carrier tape 23 from being stored in a different dust box. In contrast, a partition 151 at the right side of the first dust box 37 and a partition 152 at the left side of the second box 38 are longer than the partition 150 so as to be in touch with an outside of the flaps 35, 36, thereby preventing the carrier tape 23 from popping outside of the dust boxes, respectively. Since the flaps 35, 36 move integrally with the movable blade 30, when the carrier tape 23 is inserted into the insertion space 100, 111 before being cut, a lower end of the carrier tape 23 can be surely guided and moved to the predetermined dust box owing to the movement of the flaps 35, 36 along with the movable blade 30. The flaps are not limited to project toward the dust box side from the movable blade, and oppositely can be projected from the dust box side to the movable blade side.

In a way of driving the movable blade 30 by the driving part 39, similar to the conventional example of FIG. 6C, a disk may be fixed to a rotary shaft of the motor as an example of a main body of the driving part 39, and the roller follower (corresponding to 17 in FIG. 6C) rotatably set to the disk with an eccentricity from an axial center of the rotary shaft is loosely fitted in a long hole extending in a direction approximately orthogonal to a movement direction of the movable blade, whereby the roller follower is moved in the long hold through the rotation of the rotary shaft of the motor in the forward and backward directions. As a result, the rotational movement of the rotary shaft is converted to a linear motion of the movable blade 30 and thus, the movable blade 30 is reciprocated. However, the present invention is not restricted to this arrangement and other known structures may be suitable adopted.

The present invention is not limited to the foregoing embodiments and can be executed in various other forms.

For instance, the material of the carrier tape may be adapted to be judged by an operator, not by the control device 100.

The dust box 25 is not limited to two, i.e., the first dust box 37 and the second dust box 38. Four or more dust boxes may be arranged separately for the dust box 25, the movable blade 30, and fixed blade 33 so that the cut carrier tape can be sorted and collected.

Although one carrier tape cutting apparatus may be allotted for each component feeding apparatus, only one carrier tape cutting apparatus may be used in the component mounting machine, and may be moved by a driving device 120 such as an air cylinder or a motor, represented by chain lines in FIG. 1, to below the component feeding apparatus where the carrier tape is to be cut.

The entire disclosure of Japanese Patent Application No. 8-225920 filed on Aug. 8, 1996 including the specification, claims, drawings and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A carrier tape cutting apparatus comprising:
   a first movable cutting edge and a second movable cutting edge that are spaced from one another along a direction of movement of the first and second movable cutting edges;
   a first shearing edge and a second shearing edge that are spaced from one another along the direction of movement of the first and second movable cutting edges, wherein said first movable cutting edge is cooperable with said second shearing edge upon movement of said first movable cutting edge towards said second shearing edge to shear a first portion from a first carrier tape, and said second movable cutting edge is cooperable with said first shearing edge upon movement of said second movable cutting edge towards said first shearing edge to shear a second portion from a second carrier tape;
   carrier tape storage parts;
   a first flap movable with said first movable cutting edge such that the first portion is guided by the first flap into a respective one of said carrier tape storage parts; and
   a second flap movable with said second movable cutting edge such that the second portion is guided by the second flap into a respective another one of said carrier tape storage parts.

2. The carrier tape cutting apparatus according to claim 1, wherein said first movable cutting edge and said second movable cutting edge are each movable by being reciprocally movable.

3. The carrier tape cutting apparatus according to claim 2, wherein said first shearing edge and said second edge are positioned above said first movable cutting edge and said second movable cutting edge, said carrier tape storage parts are positioned below said first movable cutting edge and said second movable cutting edge, and said first flap and said second flap are respectively positioned below said first movable cutting edge and said second movable cutting edge.

4. The carrier tape cutting apparatus according to claim 3, wherein said first movable cutting edge and said second movable cutting edge comprise cutting edges of a reciprocally movable blade.

5. The carrier tape cutting apparatus according to claim 4, wherein said first shearing edge comprises a shearing edge of a first fixed blade, and said second shearing edge comprises a shearing edge of a second fixed blade.

6. The carrier tape cutting apparatus according to claim 5, wherein said first flap and said second flap extend downwardly from said reciprocally movable blade.

7. The carrier tape cutting apparatus according to claim 6, wherein said carrier tape storage parts comprise partitioned carrier tape storage parts.

8. The carrier tape cutting apparatus according to claim 7, and further comprising a driving device to reciprocally drive said reciprocally movable blade.

9. The carrier tape cutting apparatus according to claim 8, and further comprising a control device to control said driving device such that said reciprocally movable blade is driven in a first direction in response to a first type of carrier tape and is driven in an opposite second direction in response to a second type of carrier tape.

10. A component mounting machine comprising the carrier tape cutting apparatus according to claim 9.

11. A component mounting machine comprising the carrier tape cutting apparatus according to claim 7.

12. A method for mounting a component with the use of the component mounting machine according to claim 1, comprising:

sequentially conveying a carrier tape that holds components;

removing one of said components from said carrier tape;

mounting said one component to a board;

determining whether the reciprocally movable blade is to be driven in a first direction or an opposite second direction in response to a type of said carrier tape; and driving said reciprocally movable blade in one of said first direction and said opposite second direction in response to the type of said carrier tape, thereby shearing from said carrier tape a portion of said carrier tape from which said one component has been removed and causing the sheared portion to be sorted and collected into one of the carrier tape storage parts, wherein (i) when said carrier tape is of a first type, said portion of said carrier tape is sheared between the first movable cutting edge and the second shearing edge and is guided by the first flap into a respective one of said carrier tape storage parts, and (ii) when said carrier tape is of a second type, said portion of said carrier tape is sheared between the second movable cutting edge and the first shearing edge and is guided by the second flap into a respective another one of said carrier tape storage parts.

13. A method for mounting a component with the use of the component mounting machine according to claim 1, comprising:

sequentially conveying a carrier tape that holds components;

removing one of said components from said carrier tape;

mounting said one component to a board;

determining whether the reciprocally movable blade is to be driven in a first direction or an opposite second direction in response to a type of said carrier tape; and driving said reciprocally movable blade in one of said first direction and said opposite second direction in response to the type of said carrier tape, thereby shearing from said carrier tape a portion of said carrier tape from which said one component has been removed and causing the sheared portion to be sorted and collected into one of the carrier tape storage parts, wherein (i) when said carrier tape is of a first type, said portion of said carrier tape is sheared between the first movable cutting edge and the second shearing edge, and (ii) when said carrier tape is of a second type, said portion of said carrier tape is sheared between the second movable cutting edge and the first shearing edge.

14. The carrier tape cutting apparatus according to claim 7, wherein said carrier tape storage parts are adjacent one another, and upon reciprocal movement of said reciprocally movable blade said first flap and said second flap cooperate with one of said carrier tape storage parts to define a dropping path through which the portion sheared from either the first carrier tape or the second carrier tape falls into either the respective one of said carrier tape storage parts or the respective another one of said carrier tape storage parts.

15. The carrier tape cutting apparatus according to claim 1, and further comprising a driving device to drive said first and second movable cutting edges.

16. The carrier tape cutting apparatus according to claim 15, and further comprising a control device to control said driving device such that at least one of said first and second movable cutting edges is driven in response to a first type of carrier tape, and such that at least the other of said first and second movable cutting edges is driven in response to a second type of carrier tape.

17. A component mounting machine comprising the carrier tape cutting apparatus according to claim 1.

18. A method for mounting a component with the use of the coponent mounting machine according to claim 1, comprising:

sequentially conveying a carrier tape that holds components;

removing one of said components from said carrier tape;

mounting said one component to a board;

determining whether at least the first movable cutting edge is to be driven in a first direction or at least the second movable cutting edge is to be driven in a second direction, in response to a type of said carrier tape; and driving at least one of said first and second movable cutting edges in one of said first and second directions in response to the type of said carrier tape, thereby shearing from said carrier tape a portion of said carrier tape from which said one component has been removed and causing the sheared portion to be sorted and collected into one of the carrier tape storage parts, wherein (i) when said carrier tape is of a first type, said portion of said carrier tape is sheared between said first movable cutting edge and the second shearing edge, and (ii) when said carrier tape is of a second type, said portion of said carrier tape is sheared between said second movable cutting edge and the first shearing edge.

19. A method for mounting a component with the use of the component mounting machine according to claim 9, comprising:

sequentially conveying a carrier tape that holds components;

removing one of said components from said carrier tape;

mounting said one component to a board;

determining whether at least the first movable cutting edge is to be driven in a first direction or at least the second movable cutting edge is to be driven in a second direction, in response to a type of said carrier tape; and driving at least one of said first and second movable cutting edges in one of said first and second directions in response to the type of said carrier tape, thereby shearing from said carrier tape a portion of said carrier tape from which said one component has been removed and causing the sheared portion to be sorted and collected into one of the carrier tape storage parts, wherein (i) when said carrier tape is of a first type, said portion of said carrier tape is sheared between said first movable cutting edge and the second shearing edge and guided by the first flap into a respective one of said carrier tape storage parts, and (ii) when said carrier tape is of a second type, said portion of said carrier tape is sheared between said movable cutting edge and the first shearing edge and guided by the second flap into a respective another one of said carrier tape storage parts.

20. The carrier tape cutting apparatus according to claim 1, wherein said carrier tape storage parts are adjacent one another, and upon movement of said first and second movable cutting edges said first flap and said second flap cooperate with one of said carrier tape storage parts to define a dropping path through which the portion sheared from either the first carrier tape or the second carrier tape falls into either the respective one of said carrier tape storage parts or the respective another one of said carrier tape storage parts.

* * * * *